United States Patent
Fujisaki et al.

(10) Patent No.: US 7,123,539 B2
(45) Date of Patent: Oct. 17, 2006

(54) MEMORY MODULES WITH MAGNETORESISTIVE ELEMENTS AND METHOD OF READING DATA FROM ROW OR COLUMN DIRECTIONS

(75) Inventors: Koichi Fujisaki, Chiba-ken (JP); Kentaro Nakajima, Tokyo (JP); Takeshi Chujoh, Tokyo (JP); Yasuhiro Taniguchi, Kanagawa-ken (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 11/180,558

(22) Filed: Jul. 14, 2005

(65) Prior Publication Data

US 2005/0249029 A1 Nov. 10, 2005

Related U.S. Application Data

(62) Division of application No. 10/200,489, filed on Jul. 23, 2002, now Pat. No. 6,934,196.

(30) Foreign Application Priority Data

| Jul. 24, 2001 | (JP) | ............... 2001-222783 |
| Sep. 20, 2001 | (JP) | ............... 2001-286471 |
| Jun. 27, 2002 | (JP) | ............... 2002-187094 |

(51) Int. Cl.
*G11C 8/00* (2006.01)

(52) U.S. Cl. ............ 365/230.05; 365/158; 365/230.08

(58) Field of Classification Search ................ 365/158, 365/189.01, 189.03, 230.03, 230.05, 230.08
See application file for complete search history.

(56) References Cited

U.S. PATENT DOCUMENTS

| 5,267,185 | A | * | 11/1993 | Akabane et al. ............ 708/520 |
| 5,305,258 | A | * | 4/1994 | Koshizuka ............. 365/189.01 |
| 5,515,320 | A | * | 5/1996 | Miwa ....................... 365/185.1 |
| 5,629,922 | A | | 5/1997 | Moodera et al. |
| 5,636,093 | A | | 6/1997 | Gijs et al. |
| 5,650,958 | A | | 7/1997 | Gallagher et al. |
| 5,844,854 | A | * | 12/1998 | Lee ........................ 365/230.01 |
| 6,055,179 | A | | 4/2000 | Koganei et al. |
| 6,353,633 | B1 | * | 3/2002 | Her ........................ 375/240.18 |
| 6,385,122 | B1 | | 5/2002 | Chang |
| 6,804,771 | B1 | | 10/2004 | Jung et al. |

FOREIGN PATENT DOCUMENTS

| JP | A-61-246996 | 11/1986 |
| JP | A-64-059296 | 3/1989 |
| JP | A-01-151095 | 6/1989 |
| JP | A-04-263192 | 9/1992 |
| JP | A-05-109265 | 4/1993 |
| JP | 2001-084155 | 3/2001 |
| JP | A-2001-084155 | 3/2001 |

* cited by examiner

Primary Examiner—VanThu Nguyen
(74) Attorney, Agent, or Firm—Finnegan, Henderson, Farabow, Garrett & Dunner, L.L.P.

(57) ABSTRACT

A memory cell module comprises a memory cell array formed by memory cells of M columns×N rows. Each memory cell includes a magnetoresistive element or a magnetresistive element with a semiconductor element. A memory module comprises a first access means to access the memory cell array by a column direction and a second access means to access the memory cell array by a row direction. In this manner, data is read from a magnetoresistive memory module in both row and column directions.

6 Claims, 15 Drawing Sheets

MEMORY MODULES WITH MAGNETORESISTIVE ELEMENTS AND METHOD OF READING DATA FROM ROW OR COLUMN DIRECTIONS

CROSS-REFERENCE TO RELATED APPLICATIONS

This is a division of application Ser. No. 10/200,489, filed Jul. 23, 2002, now U.S. Pat. No. 6,934,196 which is incorporated herein by reference.

This application is based upon and claims the benefit of priority from the prior Japanese Patent Application No. 2001-222783, filed Jul. 24, 2001, the prior Japanese Patent Application No. 2001-286471, filed Sep. 20, 2001, and the prior Japanese Patent Application No. 2002-187094, filed Jun. 27, 2002, the entire contents of which are incorporated herein by reference.

BACKGROUND OF THE INVENTION

1. Field of the Invention

The present invention relates to memory modules having a magnetoresistive element, a memory system using the memory modules, an information processing apparatus and a method for transferring data from the memory system.

2. Description of the Related Art

An information processing apparatus, such as a personal computer, PDA, or cellular phone uses many memory modules. As for the memory module, implementation using a DRAM, a SRAM, a FeRAM, an EEPROM, and so on are well known in the art. Memory cells of the memory module are volatile or lose data whenever reading data from the cells. Therefore, the memory module has a buffer memory that stores data temporarily, and it is necessary to perform a rewrite operation.

The memory module performs a collective writing of data to the memory cells where an activated column line and row line cross. Therefore, the memory module is not able to electrically connect both read-sense circuits and read-drive circuits to both a column direction and a row direction of each memory cell, although the memory cell has a symmetrical structure in both the column direction and the row direction. In other words, a control device, which controls the memory module can not directly access a memory cell of the memory module symmetrically by the column direction and the row direction.

The memory module collectively writes and reads data in a unit of a data width (for example, 8 bits). In case of the information processing apparatus having memory modules, the information processing apparatus uses a memory system that arranges a plurality of memory modules in parallel. The number of the memory modules is based on a data bus width (for example, 32 bits) in the information processing apparatus. That is, the information processing apparatus reads a data from the memory system and writes data to the memory system in a unit of the data bus width. Further, the information processing apparatus performs a burst transfer which transfers data blocks continuously in a unit of the data bus width.

An information processing apparatus may use an interleave method at the time of the data transfer, in order to cope with a lack of continuous data. The interleave method rearranges data of a column direction into data of a row direction and transfers the rearranged data by every column direction. The interleave method increases the processor load. Japanese Patent Publication "KOKAI" No. 2001-084155 discloses a memory circuit which performs the interleave method exclusively. However, to use the exclusive circuit is problematic in that the information processing apparatus is made larger. Moreover, for example, the information processing apparatus may read data stored in a rectangular area of a memory system and may transfer the rectangular area to a graphic processor. Since the memory system comprises the above memory modules, the information processing apparatus must read data from the memory system by a unit of the data bus width and by every row. In almost all cases, a bit size of a column direction of the rectangular area is different from the data bus width. The data transfer efficiency is poor because the transferred data includes much unnecessary data.

BRIEF SUMMARY OF THE INVENTION

According to embodiments of the present invention, there is provided a memory module which is able to access both a column direction and a row direction.

According to an embodiment of the present invention, a memory module is provided including: a memory array including memory cells of M columns×N rows; M column lines, each column line connected with each memory cell configured to each column direction; N row lines, each row line connected with each memory cell configured to each row direction; a power source line; m column input/output lines to input and output data in a column direction, where m is greater than or equal to 1 and less than M; n row input/output lines to input and output data in a row direction, where n is greater than or equal to 1 and less than N; a column address decoder, for receiving a column address and a column access direction signal, the column address decoder configured to decode the column address and to selectively connect either between a column line specified by the column address and the power source line or between m column lines specified by the column address and m column input/output lines, according to the column access direction signal; and a row address decoder, for receiving a row address and a row access direction signal, the row address decoder configured to decode the row address and to selectively connect either between n row lines specified by the row address and n row input/output lines or between a row line specified by the row address and the power source line, according to the row access direction signal.

DETAILED DESCRIPTION OF THE INVENTION

Figure 1:
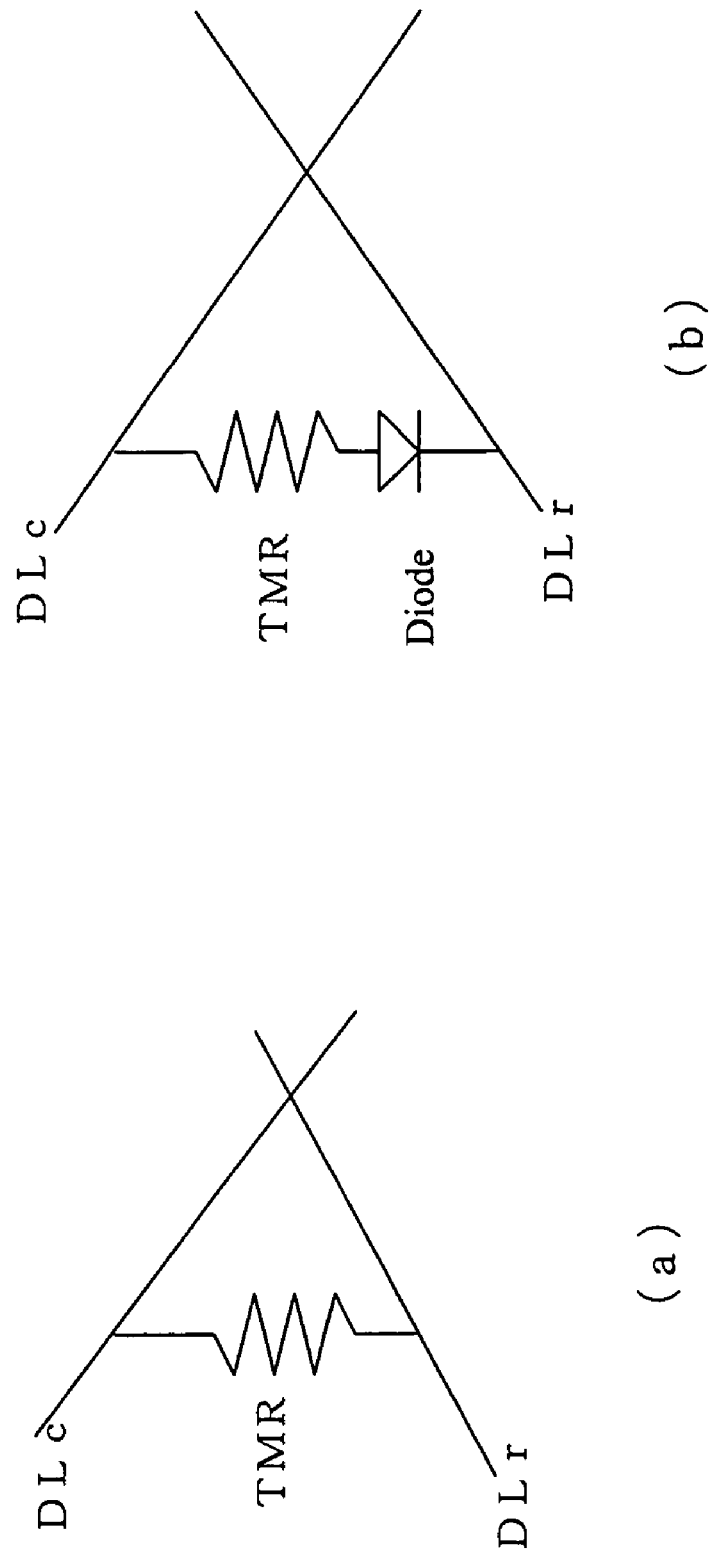
FIGS. 1(a) and 1(b) are representations of an exemplary memory cell comprising a tunnel magnetoresistive effect element.

A memory module having a magnetoresistive element, a memory system using one or more memory modules, an information processing apparatus and a method for transferring data from the memory system according to embodiments of the present invention will now be described with reference to the accompanying drawings.

First, a memory cell in a memory module consistent with an embodiment of the present invention is explained in detail. The memory cell of the embodiment should to satisfy the following requirements:

(1) a structure of the cell is symmetrical about a row direction and a column direction;

(2) the structure of the cell is electrically connectable to a read-sense circuit and a write-sense circuit with both a row direction and column direction;

(3) the cell is non-volatile; and (4) nondestructive read is possible.

To implement a memory cell that satisfies such requirements, it is suitable to use a magnetoresistive-effect element which is connected to the semiconductor rectifying device in series or a magnetoresistive-effect element which has a rectification property.

The magnetoresistive-effect element may be a single ferromagnetic-material thin film or a thin film element which laminates a plurality of ferromagnetic-material thin films to non-magnetic material, the insulator, and the semiconductor. Specifically, anisotropic magnetoresistive-effect elements, large magnetoresistive-effect elements, tunnel magnetoresistive-effect elements, Hall-effect devices, etc. are known. Each of these includes elements made into a magnetization direction to a specific criteria of a ferromagnetic-material thin film, or includes elements which create storage information magnetization arrangements of a plurality of ferromagnetic-material thin films. Storage information can be read by detecting the resistance of the element depending on a magnetization direction or a magnetization arrangement.

A detection method of the resistance of the element is realizable by either:

(1) passing fixed current and measuring a voltage drop in the element; or (2) supplying a fixed voltage to the cell and measuring a current flowing into the element.

Since a memory cell using the magnetoresistive-effect element includes a nondestructive read in a non-volatile cell and is a resistor, polarity does not exist. Reading a memory cell having a magnetoresistive-effect element, can be selected by controlling the potential difference of the element at both terminals without using a transistor for selection, since the memory cell using the magnetoresistive-effect element is an element of the current-passing type. Writing data on the element is performed by passing current to wiring near the element and using a current magnetic field generated near the wiring. Selecting cells for writing data is performed by passing effective current, which exceeds a reversal magnetic field of the element to two wirings or lines, and generating the current magnetic field around a cross portion of the two wirings. Each wiring is insulated electrically. That is, the symmetric property of a cell array is maintained also in a write operation.

In addition, the two wiring mode for writing may be combined with the two wiring mode (a column line and a row line) used for reading. In this case, in order to maintain the electrical isolation between the column line and the row line, it is suitable to use a magnetoresistive-effect element which connects a semiconductor rectifying device in series, or which has a rectifying property in itself. In the case of using only a magnetoresistive-effect element, it is necessary to form a writing wiring in addition to the column line and the row line. Even in this case, the writing wiring can combine the column line or the row line.

As an example of a magnetoresistive-effect element, a basic composition of the memory cell using a tunnel magnetoresistive-effect element (TMR element) is shown in FIG. 1.

FIG. 1(*a*) is an example of one memory cell from a tunnel magnetoresistive-effect element. Since the cell composition is symmetrical, though it exchanges the column line DLc and the row line DLr, it operates similarly to that described above. In this memory cell, when a constant voltage is supplied from a sense source to the column line DLc, a resistance value (storage state) of the tunnel magnetoresistive-effect element is detected by detecting the current value which flows via a tunnel magnetoresistive-effect element to a row line DLr with a read-sense amplifier. In another detecting method, the resistance value (storage state) of the tunnel magnetoresistive-effect element may be detected by detecting the voltage level between the row line DLr and the column line DLc by the read sense amplifier while supplying constant current from the column line DLc via a tunnel magnetoresistive-effect element to the row line DLr. In yet another detecting method, the resistance value (storage state) of the tunnel magnetoresistive-effect element may be detected by using a drive means and a sense means.

FIG. 1(*b*) is an example of one memory cell formed from a tunnel magnetoresistive-effect element and a diode. In this case, when a column line and a row line are exchanged, although a polarity of the diode differs, it operates similarly by changing suitably a voltage direction impressed to the column line and the row line. The drive circuit and a sense circuit may be arranged at the column line DLc and the row line DLr. The drive circuit and the sense circuit of at least the unit of data width may be connected to a plurality of column line DLc(s) and row line DLr through a transfer gate controlled by the address decoder. Further, in a preferred embodiment, the sense circuit is regarded as a multi-stage composition in order to optimize signal-to-noise ratio (S/N) at the time of sensing.

Figure 2:
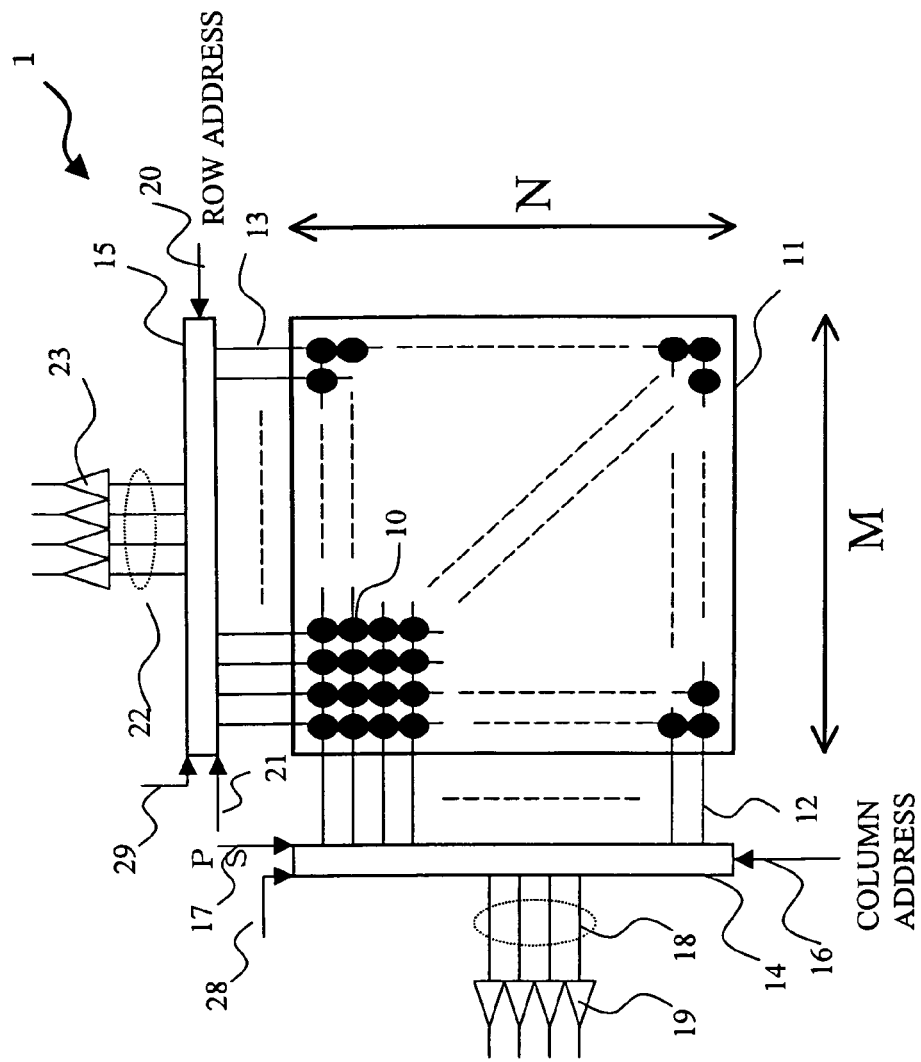
FIG. 2 is a diagram showing a memory module consistent with an embodiment of the present invention.

FIG. 2 shows a memory module 1 using a memory array 11 which arranges the M memory cells by column and N memory cells by row.

The memory array 11 arranges the M×N memory cells 10 in the shape of an array. Each memory cell 10 is connected to one column line 12 and one row line 13. There are N column lines 12 and each column line 12 is connected to a column address decoder 14. There are M row lines 13 and each row line 13 is connected to a row address decoder 15.

The column address decoder 14 is connected to a column address line 16 for obtaining a column address from an external source. Moreover, the column address decoder 14 is connected via an access direction signal line 28 which acquires an access direction signal for indicating a row direction access or a column direction access. Moreover, the column address decoder 14 is connected to a power supply via a power supply line 17. The column address decoder 14 is further connected to I/O lines 18 which input/output data from/to external sources. The I/O lines 18 are connected to a sense amplifier 19 for detecting a voltage drop by a resistance of the memory cell and amplifying the voltage upon data being outputted to the external sources.

The row address decoder 15 is connected with a row address line 16 for obtaining a row address from the external sources. Moreover, the row address decoder 15 is connected with an access direction signal line 29 which acquires the access direction signal for indicating the row direction access or the column direction access. The row address decoder 15 is further connected to the power supply via a power supply line 21. In addition, the power supply line 21 operates with the power supply line 17. Moreover, the row address decoder 15 is connected to I/O lines 22 which input/output data from/to external sources. The I/O lines 22 are connected to the sense amplifiers 23 for detecting a voltage drop by a resistance of the memory cell and amplifying the voltage upon data being outputted to the external sources.

Figure 3:
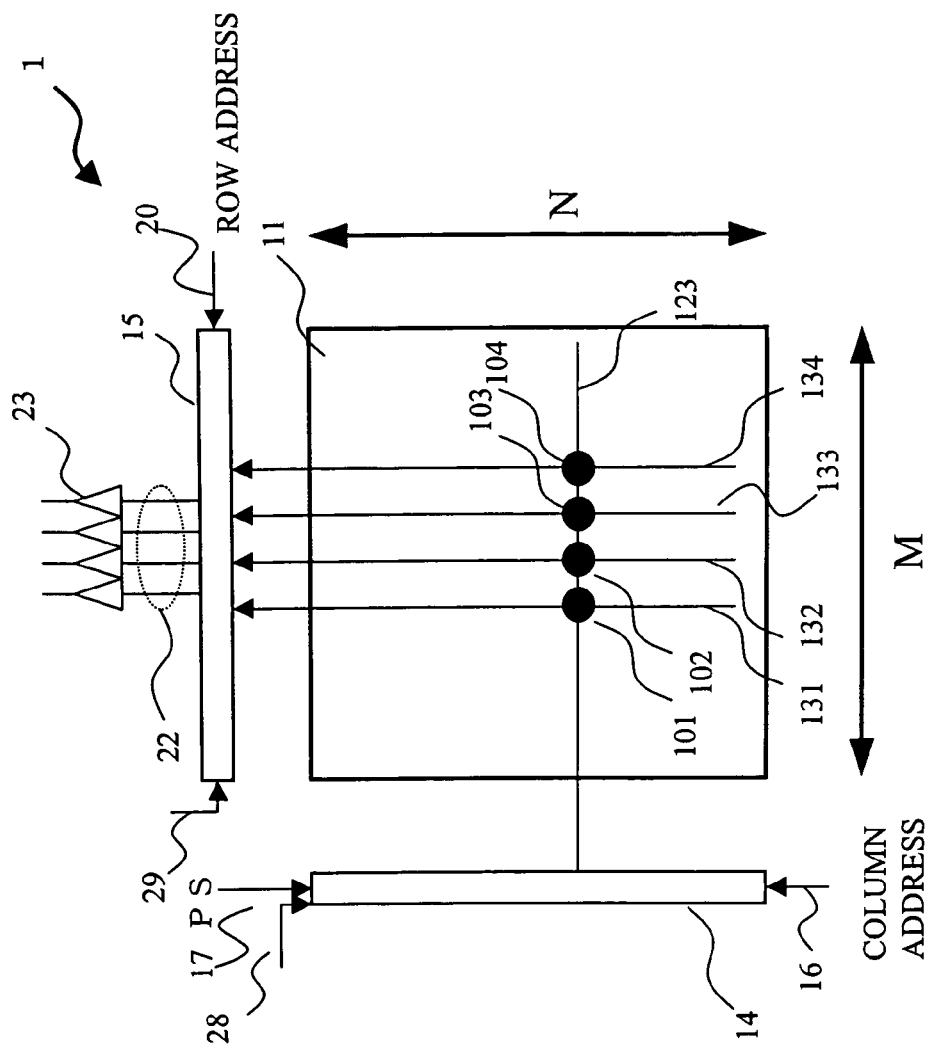
FIG. 3 is a diagram showing an operation for performing "a read of the data to a column direction" from a memory array according to the invention.
Figure 4:
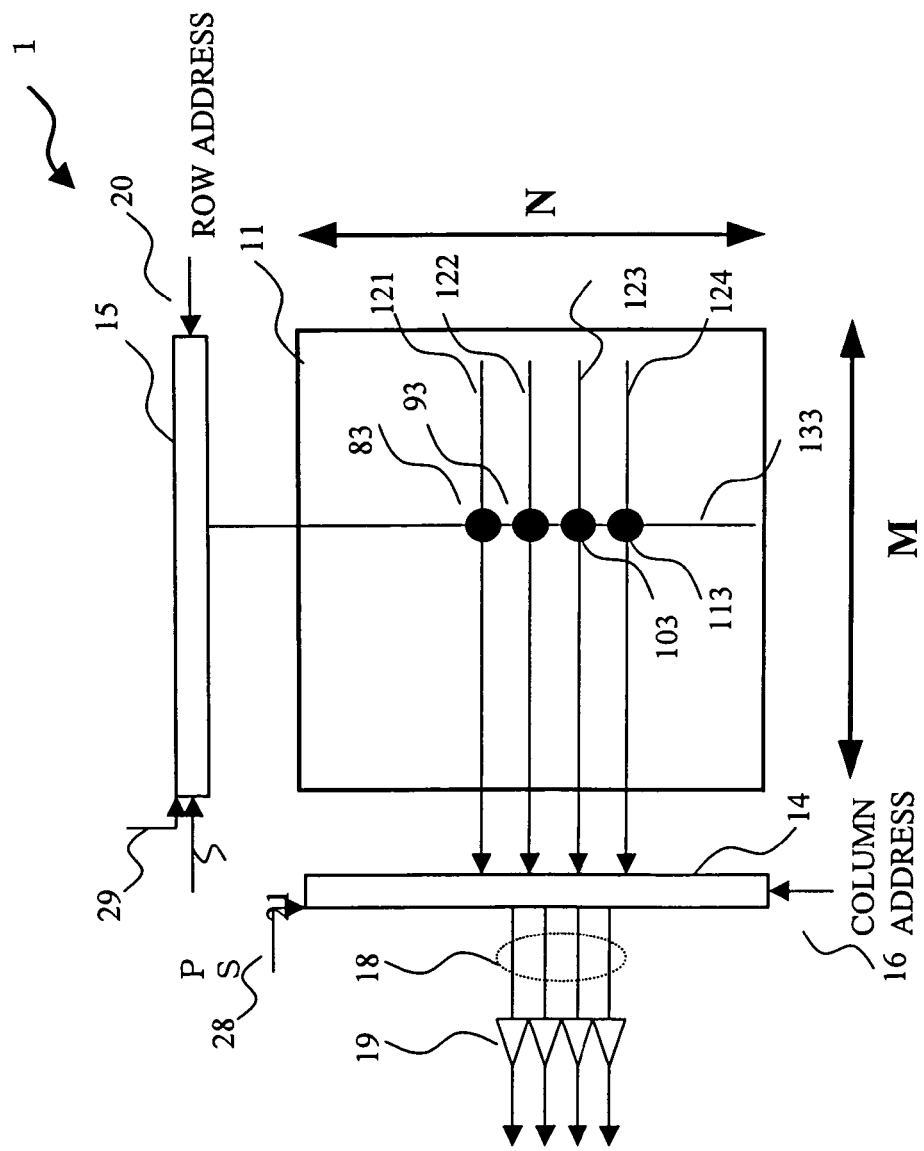
FIG. 4 is a diagram showing an operation for performing "a read of the data to a row direction" from a memory array according to the invention.

Next, FIG. 3 and FIG. 4 show a read operation of the data from the memory module 1 as an example, considering a data width as 4 bits.

FIG. 3 shows a operation for performing "a read of the data to a column direction" from the memory array 11. Memory cells 101–104 can be read as a data block in a unit of data width (4 bits) by supplying an access direction signal which shows a row direction access and specifying an address of the data block including an address of the memory cell. The address consists of a row address and a column address. The row address of the address specified from an external source is sent to the row address decoder 15 through the row address line 20, and the column address is sent to the column address decoder 14 through the column address line 16.

The row address decoder 15 decodes the row address, and selects four row lines 131–134 according to a decode result. The row lines 131–134 are connected with the I/O lines 22 by the access direction signal that indicates a row-writing direction from the access direction signal line 29 respectively. On the other hand, the column address decoder 14 decodes the column address, and selects one column line 123 according to a decode result. The column line 123 is connected with the power supply line 17 by the access direction signal that indicates a column direction from the access direction signal line 28. As a result, constant current flows to each memory cell on the column line 123 selected, and the voltage drops according to resistance states of each memory cell respectively. The sense amplifiers 23 on the I/O lines 22 connected with the column lines 131–134 detect voltage drops dropped the memory cells 131–134, and after being amplified to a sufficient level, they are outputted to the external sources of a memory module 1.

In addition, when applying constant voltage to a cell and detecting current, the above operation read will be similar.

In the case of "a read of data to a column direction", it is fundamentally carried out in a similar operation. FIG. 4 shows operation of "the read of data to a column direction."

The memory cell 103 can be read as a data block in unit of data width (4 bits) by supplying the access direction signal which shows row direction access and specifying an address of the data block including an address of the memory cell 103. The row address of the address specified from the external source is sent to the row address decoder 15 through the row-address line 20, and the column address is sent to the column address decoder 14 through the column address line 16.

The column address decoder 14 decodes the column address, and selects four column lines 121–124 according to a decode result. The column lines 121–124 are connected to the I/O lines 18 by the access direction signal which indicates the column direction from the access direction signal line 28 respectively. On the other hand, the row address decoder 15 decodes the row address, and selects one row line 133 according to a decode result. The row line 133 is connected with the power supply line 21 by the access direction signal which indicates a column direction from the access direction signal line 29. As a result, constant current flows to each memory cell on the row line 133 selected, and the voltage drops according to resistance states of each memory cell respectively.

The sense amplifiers 19 on the I/O lines 18 connected with the column lines 121–124 detect voltage dropped by the memory cells 83, 93, 103 and 113, and after being amplified to a sufficient level, they are outputted to the external sources of the memory module 1.

In addition, when impressing constant voltage to a cell and detecting current, the above operation read would be a similar operation.

As explained above, the memory module 1 of the described embodiment can read data in cells in any direction of a row direction and the column direction. Although the read-out operation has been described in detail here, the memory module 1 of the embodiment can write data in cells in any direction of the row direction and the column direction similarly to the read data operation explained above.

Figure 5:
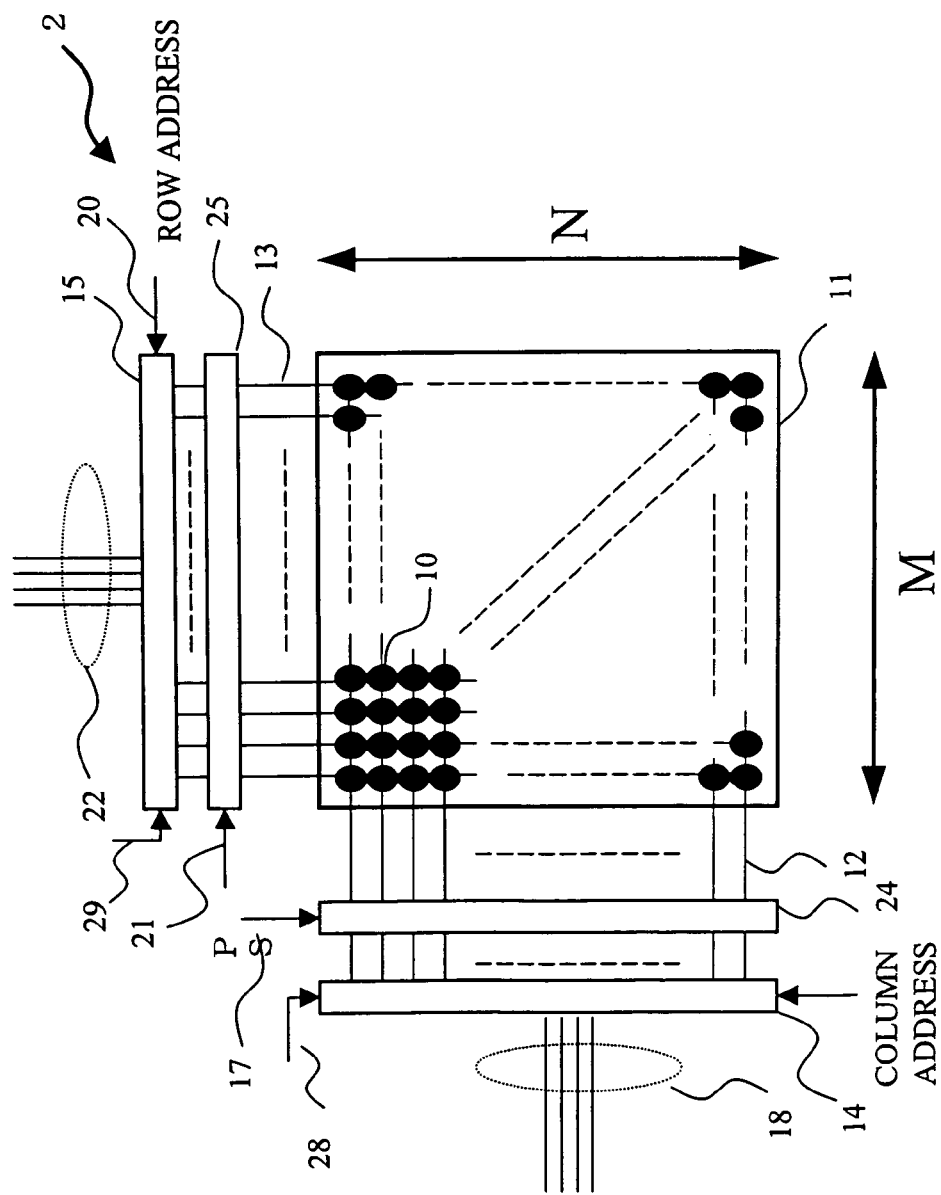
FIG. 5 is a diagram showing a memory module consistent with another embodiment of the present invention.

FIG. 5 shows another embodiment of a memory module 2.

The memory module 2 has a latch amplifier 24 between the column lines 12 and the column address decoder 14 and a latch amplifier 25 between the row lines 13 and the row address decoder 15 instead of the sense amplifiers 19 and 23 of a memory module 1. Other circuit elements do not change. An advantage of the memory module 2 is that it uses the same latch amplifier as DRAM for the data sense, and thus it is to be able to accommodate the large bandwidth of data. That is, as shown in FIG. 5, when sense current/voltage is activated in the column direction, in the latch amplifier of a column direction, the data of all the memory cells of the row can be stored. Therefore, a very large number of simultaneous cells can be read (it does not necessarily need to be equal to data bus width).

Figure 6:
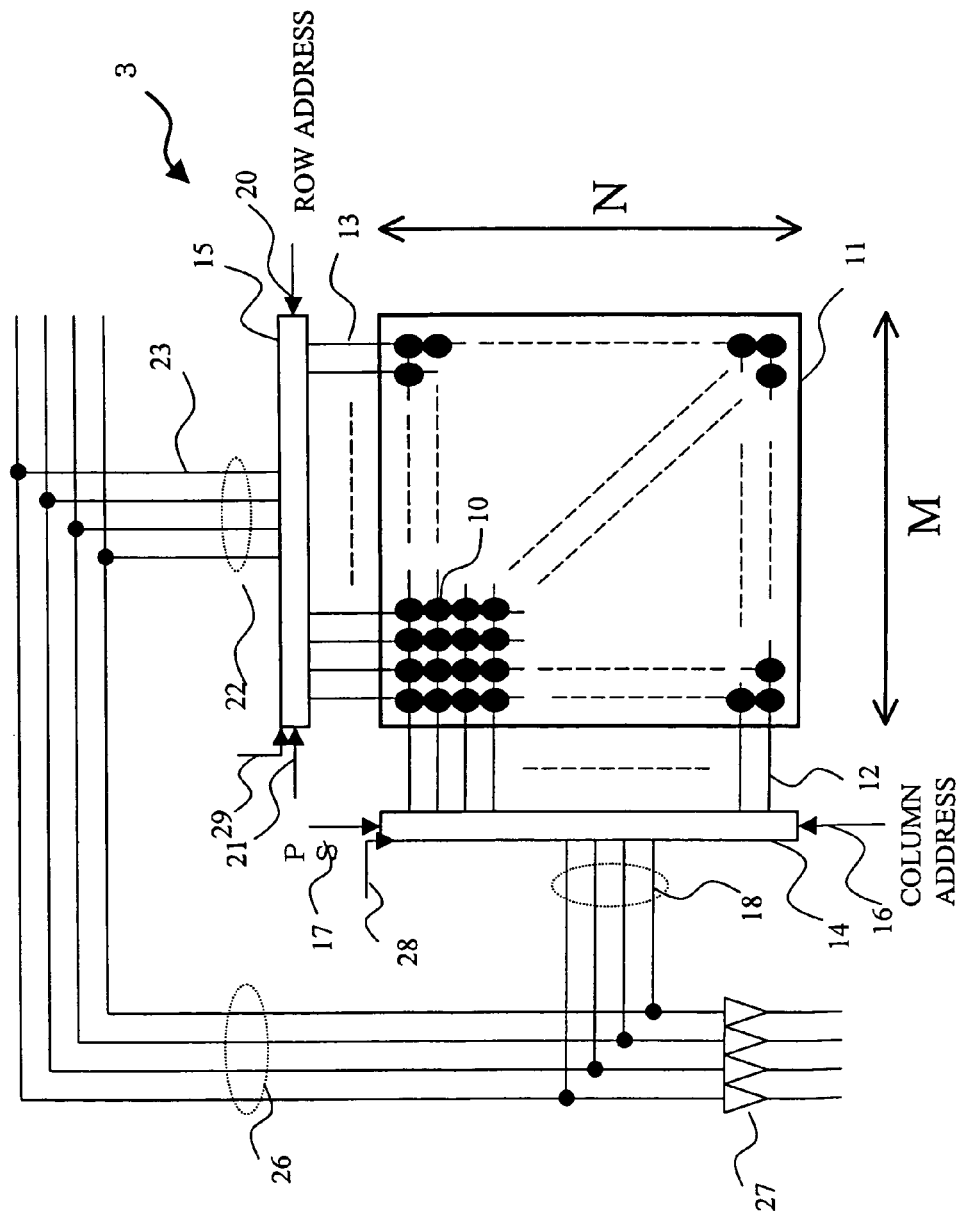
FIG. 6 is a diagram showing a memory module consistent with still another embodiment of the present invention.

Another embodiment of a memory module 3 will now be explained with reference to FIG. 6. The memory module 3 combines the I/O lines 18 and the I/O lines 22 to obtain cooperation lines 26 without placing sense amplifiers 19 and 23 as in memory module 1, and has sense amplifiers 27. Other circuit elements do not change. Thus, since the memory module 3 is comprised above, the memory module 3 is able to have a same number of data lines for being connected to external sources as the number of data line of a previously-described memory module but uses half of the sense amplifiers as for memory module 1.

Next, applications using the above memory module 1–3 are explained below.

The memory module 1 or 2 among the memory modules 1–3 is suitable for realizing an interleave method used at the time of data transfer. The interleave method is now explained.

When performing a data transfer, some errors, such as a bit of data reversed under the influence of noise during the data transfer, may occur. There are two types of the errors at this time. One is a random error, which is not continuous error, and another is a burst error, which is continuous error. A random error and a burst error occur during the data transfer. In order to restore original data from data including the error, an error correction coding of the original data is carried out, and the coded data is transferred in certain cases.

Generally, the error correction code used for the data transfer uses the random error correction code in consideration of the efficiency of coding. Although transferred data which has included the error effectively to a random error is able to be restored, on the other hand, the transferred data may have the fault of being corrupted, due to a burst error.

There is an interleave method, which may be used as one of the measures to counter the burst error. In the case of the data transfer, a transmitting side uses the interleave method to replace the bit string of data in a prescribed procedure and transfer data. In a receiving side, it is rearranged such that the received data in a prescribed procedure is used to obtain original data. It is referred to as a de-interleave method, described below.

Even when carrying out the random error correction coding of the original data and further performing the interleave method, the probability by which influenced data by the burst error can be restored to the original data becomes high. This is because the part of the burst error is distributed by carrying out the de-interleave method of the data which the receiving side received. It can correct certain distributed continuous error as similar as a random error.

Figure 7:
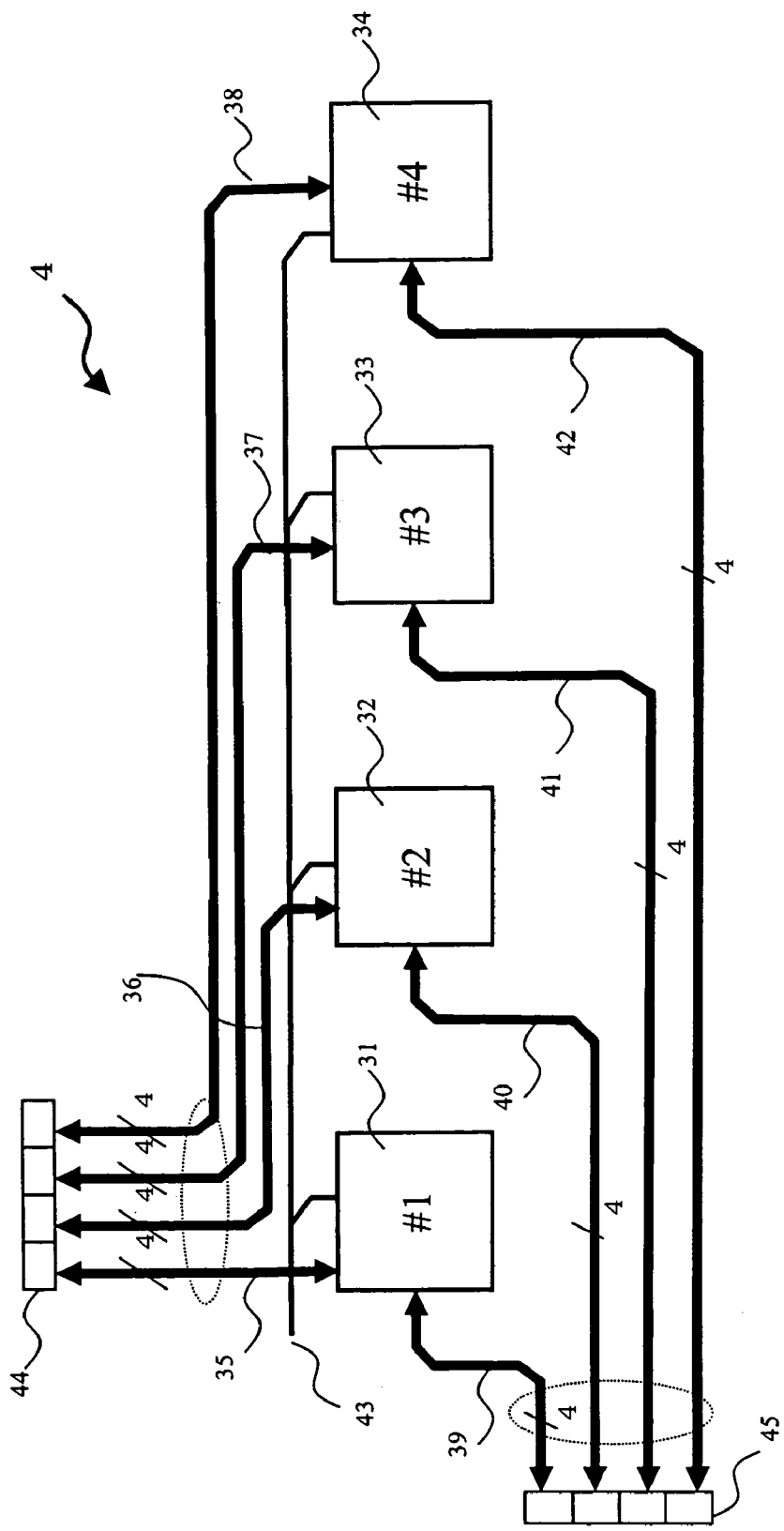
FIG. 7 is a diagram showing a memory system using the certain embodiments of memory modules according to the invention.

FIG. 7 shows a memory system 4 as an application example 1 which uses the interleave method. The memory system 4 has parallel memory modules which have data width as 4 bits respectively and has a data bus width of 16 bits.

Each memory module 31–34 is equivalent to the memory module 1 or 2. The column side data register 44 is connected to I/O lines 22 of each memory module 31–34 via column side data buses 35–38. Similarly, the row side data register 45 is connected to I/O lines 18 of each memory module 31–34 via row side data buses 39–42. An address bus 43 is connected to each memory module 31–34. An address from the address bus 43 is separated into a row address and a column address inside of each memory module 31–34. The column address is supplied to the column address line 16 and the row address is supplied to the row address line 20 respectively. Moreover, although not illustrated, the memory system 1 arranges a signal line for a data read request signal, a signal line for a data write request signal, and a signal line for an access direction signal indicated a row direction/column direction to each memory module 31–34.

Figure 8:
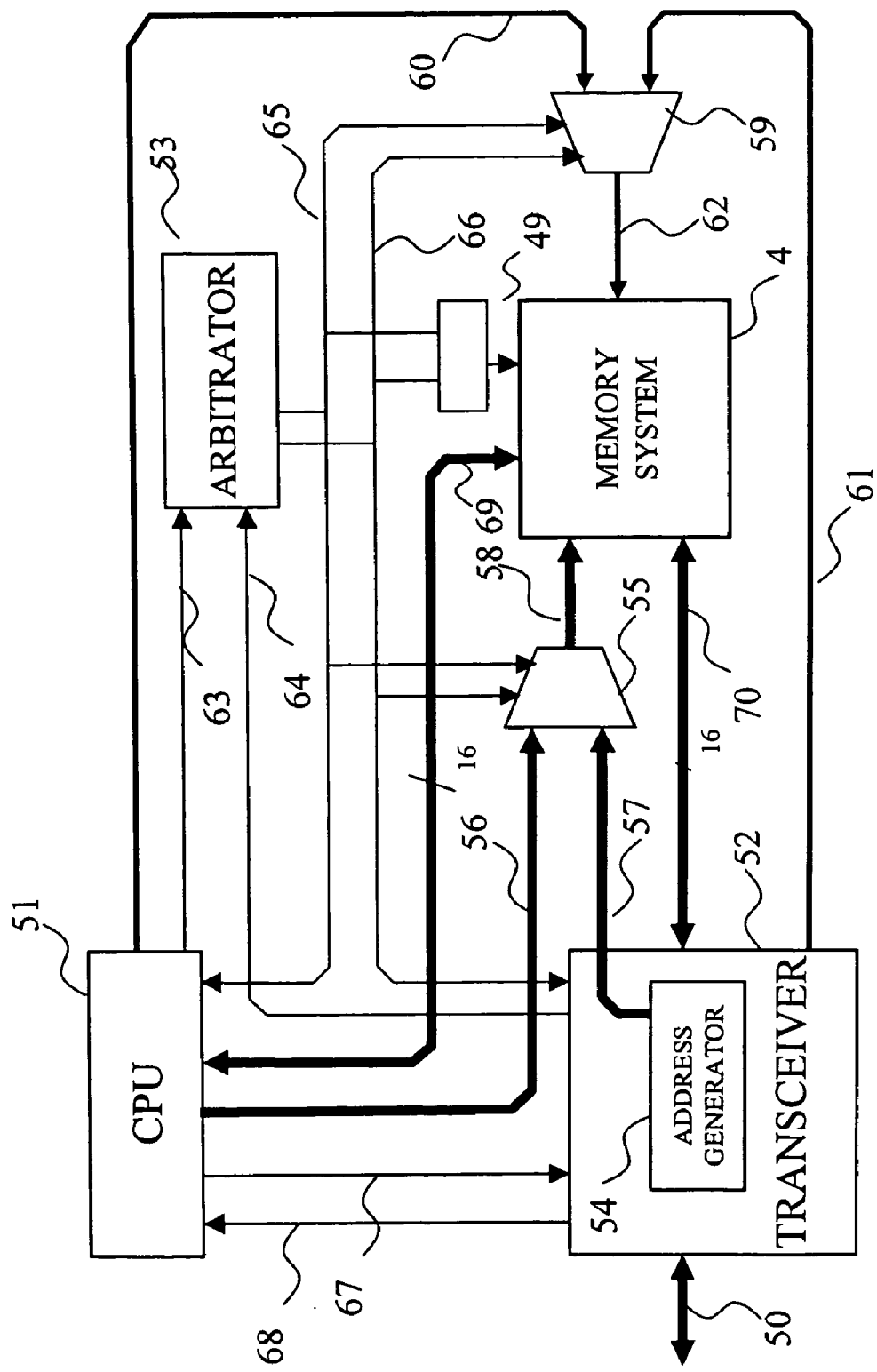
FIG. 8 is a diagram showing an exemplary circuit concerning a data transfer of the information processing system using the memory system according to the invention.

FIG. 8 shows an example of an information processing system using the memory system 4 of FIG. 7.

A CPU 51 has a random error correction coding processing function which reads data from the memory system 4, codes the read data by the random error correction coding, and writes the coded data in the memory system 4. The CPU 51 also has the random error correction decoding processing function that decodes the data that is coded by the random error correction coding. The CPU 51 also has a function for requesting a data transmission to a transceiver circuit 52 by a transmission request signal line 67, a function for receiving a notice which is completed to receive data from externally by a receipt complete signal line 68, a function for controlling a memory system 4, a function for outputting a memory address, and another request signals. The CPU 51 is also connected to the column side c data bus 69 which sends and receives data with the memory system 4.

The transceiver circuit 52 has a function for transmitting and receiving data through an external buses 50 from / to external, a function for processing the data transmission and reception request from CPU 51, and a function to perform writing or reading data to / from the memory system 4 and directly. The transceiver circuit 52 is also connected to the low side c data bus 70 which transmits and receives data with the memory system 4. An address-generation circuit 54 set in the transceiver circuit 52 has a function which generates the address supplied to the memory system 4 when the transceiver circuit 52 performs writing and reading the data directly to the memory system 4.

An address selector 55 has a function for selecting any of the addresses sent from CPU 51 through the c address bus 56, or the address sent from the transceiver circuit 52 through the t address bus 57 and outputting the address to the memory system 4 through an address bus 58. Similarly, a control signal selector 59 has a function for selecting any of the control signal sent from CPU 51 through c control signal bus 60, or the control signal sent from the transceiver circuit 52 through t control signal bus 61 and outputting the control signal to the memory system 4 through a control signal bus 58. The address selector 55 and the control signal selector 59 select control signals and address whether from CPU 51 or from transceiver circuit based on a c acknowledge signal line 65 or a t acknowledge signal line 66 from an arbitrator 53.

The arbitrator 53 has a function of arbitrating whether the access privilege of the memory system 4 is granted for any of CPU 51 or the transceiver circuit 52, based on the request signal received through the c memory system request signal line 63 from the CPU 51, and the request signal received through the t memory system request signal line 64 from the transceiver circuit 52.

An arbitrating result is reported to each by activating either the c acknowledge signal line 65 or the t acknowledge signal line 66.

An access direction decoder 49 senses activation of the c acknowledge signal line 65 or the t acknowledge signal line 66 from the arbitrator 53, and reports row-direction access or column-direction access to the memory system 4.

In this example, access from the CPU 51 is equivalent to the row-direction access, and access from the transceiver circuit 52 is equivalent to the row direction access.

In the example of the circuit of FIG. 8 explained above, an operation in the case of reading data from the memory system 4 and transmitting the read data and an operation in the case of restoring the transmitted data to the memory system 4 concerned will be explained below.

When reading data from the memory system 4 and transmitting the read data to the external sources, first, operation of the random error correction coding of the data stored in the memory system 4 is performed. The operation of the random error correction coding is explained in detail. As a premise, on the memory system 4, data to transmit will previously have been stored.

The CPU 51 activates the c memory system request signal line 63, in order to acquire an access privilege of the memory system 4. Thereby, the request is notified to the arbitrator circuit 53. When it is judged that the access privilege of the memory system 4 may be granted to the CPU 51, the arbitrator 53 activates the c acknowledge signal line 65, and notifies CPU 51 of the access privilege of the memory system 4. If this notice is received, the CPU 51 transmits the control signal for reading to the c control signal bus 60, and transmits the address to the c address bus 56. An address selector 55 senses that the c acknowledge signal line 65 is activated, selects the side of the CPU 51, and transmits an address transmitted from the c address bus 56 to the memory system 4 through the address bus 58. Similarly, the control signal selector 59 senses that the c acknowledge signal line 65 is activated, selects the side of the CPU 51, and transmits the control signal transmitted from the c control signal bus 60 to the memory system 4 through the control signal bus 62.

The address transmitted to the memory system 4 is separated into a column address and a row address in the each of memory modules 31–34. The column address is supplied to the column address decoder 14 of each memory module 31–34 in the memory system 4 and a row address is supplied to the row address decoder 15 of each memory module 31–34 in the memory system 4. Moreover, the access direction decoder 49 senses that the c reply signal line 65 is activated, and supplies the access direction signal indicating the row direction access to the memory system 4. The signal is supplied to the column address decoder 14 and to the row address decoder 15 in each memory module 31–34. The column address decoder 14 of each memory module 31–34 connects one column line 12 selected corresponding to the column address and the sense power supply 17. On the other hand, the row address decoder 15 of each memory module 31–34 selects four (continuous) row lines 13 corresponding to the row address respectively. By this operation, 4-bit data is outputted from the I/O line 22 of each memory module 31–34 respectively, and the data is stored in the column side data register 44 through the column side data bus 35–38. Data stored 16-bit in the column side data register 44 is supplied to the CPU 51 through the c data bus 69.

The CPU 51 carries out the random error correction coding processing of the supplied data.

All of the processed data is restored to the memory system 4. The CPU 51 requires the access privilege of the memory system 4 of the arbitrator 53 again for the restore process. When it is judged that the access privilege of the memory system 4 may be granted to the CPU 51, the arbitrator 53 activates the c acknowledge signal line 65, and notifies CPU 51 of the access privilege of the memory system 4. If this notice is received, the CPU 51 transmits the control signal for writing to the c control signal bus 60, and transmits the address for writing to the c address bus 56. The data from the column side c data bus 69 is stored temporarily at the column side data register 44. An address selector 55 senses that the c acknowledge signal line 65 is activated, selects the side of the CPU 51, and transmits the address transmitted from the c address bus 56 to the memory system 4 through the address bus 58. Similarly, the control signal selector 59 senses that the c acknowledge signal line 65 is activated, selects the side of the CPU 51, and transmits the control signal transmitted from the c control signal bus 60 to the memory system 4 through the control signal bus 62.

The address transmitted to the memory system 4 is separated into a row address and a column address in the each memory modules 31–34. The column address is supplied to the column address decoder 14 of each memory module 31–34 in the memory system 4 and the row address is supplied to the row address decoder 15 of each memory module 31–34 in the memory system 4. Moreover, the access direction decoder 49 senses that the c reply signal line 65 is activated, and supplies an access direction signal indicating the column direction access to the memory system 4. The signal is supplied to the column address decoder 14 and to the row address decoder 15 in each memory module 31–34. The column address decoder 14 of each memory module 31–34 connects one column line 12 selected corresponding to the column address and the sense power supply 17. On the other hand, the row address decoder 15 of each memory module 31–34 selects four (continuous) column lines 13 corresponding to the row address and the selected four row lines 13 are connected to column side data bus 35–38 respectively. Thereby, each data from the row line 13 is written in each memory cell which one column line 12 and the four column lines 13 intersect.

By repeating the operation mentioned above, the random error correction coding of all the transmitted data is performed. The operation of the random error correction coding is completed by the above.

Next, all the data which performs the operation of the random error correction coding transfers through the external bus 50 from the transceiver circuit 52. The transceiver circuit 52 will start a transfer operation, if the transmission request signal 67 is received from the CPU 51. The transceiver circuit 52 activates at memory system request signal line 64 to the arbitrator 53 in order to acquire an access privilege of the memory system 4. When it is judged that the access privilege may be granted to the transceiver circuit 52, the arbitrator 53 activates the t acknowledge signal line 66 and notifies transceiver circuit 52 of the access privilege of the memory system 4. The transceiver circuit 52 which received the notice starts an address generation circuit 54, and the address generation circuit 54 generates an address for reading supplied to the memory system 4. The generated address is outputted from the t address bus 57. Moreover, the transceiver circuit 52 outputs a control signal for reading to the t control signal bus 61. These signals outputted from the transceiver circuit 52 are transferred to the address selector 55 and the control signal selector 59. At this time, these selectors 55 and 59 sense that the t acknowledge signal line 66 of the arbitrator 53 is activated, and supply the address and the signals from the transceiver circuit 52 to the memory system 4 respectively.

The address transmitted to the memory system 4 is separated into a row address and a column address in each of memory modules 31–34. The column address is supplied to the column address decoder 14 of each memory module 31–34 in the memory system 4 and a row address is supplied to the row address decoder 15 of each memory module 31–34 in the memory system 4. Moreover, the access direction decoder 49 senses that the t acknowledge signal line 66 is activated, and supplies a access direction signal indicating the row direction access to the memory system 4. The signal is supplied to the column address decoder 14 and to the row address decoder 15 in each memory module 31–34. The column address decoder 13 of each memory module 31–34 selects four (continuous) column lines 12 corresponding to the column address and is connect the four column lines to the row side data buses 39–42. On the other hand, the row address decoder 15 of each memory module 31–34 connects one row line 13 selected corresponding to a row address and the sense power supply 21. By the operation, 4-bit data is outputted from the I/O line 18 of each memory module 31–34 respectively, and the data is stored in the row side data register 45 through the row side data bus 39–42. Data stored 16-bit in the row side data register 45 is supplied to the transceiver circuit 52 through the t data bus 70. The transceiver circuit 52 outputs the supplied data to the external bus 50.

Figure 9:
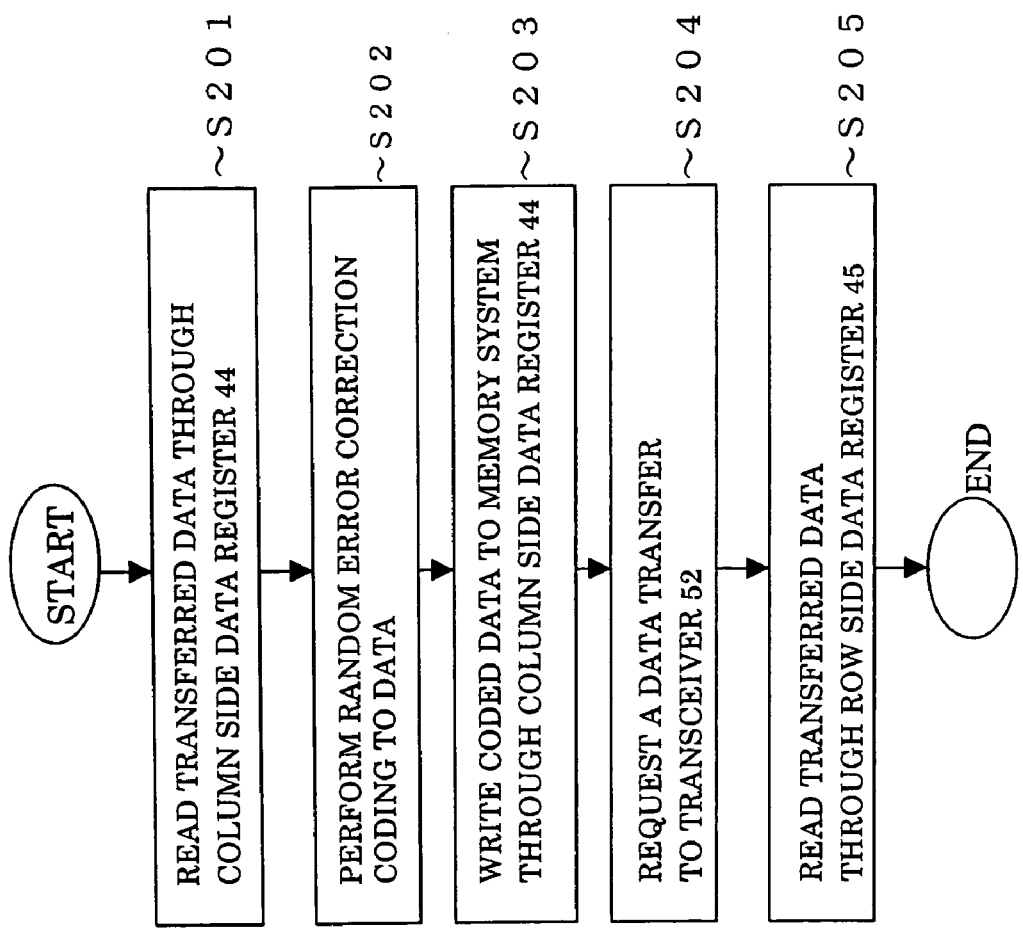
FIG. 9 is a flow chart indicating an operation for transferring data from the memory system according to the invention.

FIG. 9 shows a flow chart describing the steps of an operation explained above.

First, the CPU 51 reads data for a transfer from memory system 4 through the column side register data 44 (S201). The CPU 51 processes random error correction coding of the data for the transfer (S202). If the random error correction coding is completed to the data for the transfer, all the processed data will be written in the memory system 4 through the column side register data 44 (S203). The CPU 51 supplies a data transfer request to external to the transceiver circuit 52 (S204). The transceiver circuit 52 reads the data which was written in the memory system 4 and which was carried out the random error correction coding and transmits them through the row side data register 45 to the external bus 50 (S205).

The difference between the access direction of the memory system 4 from the CPU 51 which performs random error correction coding, and the access direction of the memory system 4 from the transceiver circuit 52 which performs the data transfer should be noted. To each memory module 31–34 which formed the memory cells in the shape of an array, the access direction of the memory system 4 of CPU 51 is the row direction and the access direction of the memory system 4 of transceiver circuit 52 is accessing the column direction. Reading in the column direction of the memory system 4 can be treated to the data and equivalence by which the interleave method was already carried out as equivalence. Then, the transceiver circuit 52 can transmit the data that is only read from the memory system 4.

Next, the case where the data transferred from the external bus 50 is restored to the memory system 4 is explained.

When the transceiver circuit 52 receives transfer data from external bus 50, the transceiver circuit 52 writes the data in the memory system 4. The transceiver circuit 52 activates the t memory system request signal line 64, in order to acquire an access privilege of the memory system 4. When it is judged to the request that the arbitrator 53 may grant the access privilege, the arbitrator 53 activates the t acknowledge signal line 66 and notifies transceiver circuit 52 or the access privilege. The transceiver circuit 52 which received the notice starts an address generation circuit 54, and the address generation circuit 54 generates an address for writing to the memory system 4. The generated address is outputted from the t address bus 57.

Moreover, the transceiver circuit 52 outputs the control signal for reading to the t control signal bus 61 and outputs the transferred data to the row side c data bus 70. The data from the row side c data bus 70 is stored temporarily at the row side data register 45. An address selector 55 senses that the t acknowledge signal line 66 is activated, selects the transceiver circuit 52 side, and transfers the address from the t address bus 57 to the memory system 4 through the address bus 58. Similarly, the control signal selector 59 senses that the t acknowledge signal line 66 is activated, selects the transceiver circuit 52 side, and transfers the control signal from the t control signal bus 61 to the memory system 4 through the control signal bus 62.

The address transmitted to the memory system 4 is separated into a row address and a column address in the each memory module 31–34. The row address is supplied to the row address decoder 14 of each memory module 31–34 in the memory system 4 and a column address is supplied to the row address decoder 15 of each memory module 31–34 in the memory system 4. Moreover, the access direction decoder 49 senses that the t reply signal line 66 is activated, and supplies an access direction signal indicating the column direction access to the memory system 4. The signal is supplied to the column address decoder 14 and to the row address decoder 15 in each memory module 31–34. The column address decoder 14 of each memory module 31–34 selects four (continuous) column lines 12 corresponding to the column address and is connect the four column lines to the column side data buses 39–42. On the other hand, the row address decoder 15 of each memory module 31–34 connects one row line 13 selected corresponding to the row address and the sense power supply 21. Thereby, each data from the column line 12 is written in each memory cell which one column line 13 and the four row lines 13 intersect.

By repeating the above process, all the transmitted data stored.

When the transceiver circuit 52 finishes transferring all of the data, the transceiver circuit 52 notifies completion of all of the data transfer to CPU 51. The notice is performed by activating the receiving completion signal line 68. The CPU 51 starts decryption processing of the transmitted data after receiving the notice. For decryption of data, the CPU 51 acquires an access privilege of the memory system 4, and activates the c memory system request signal line 63.

Subsequent operation is carried out contrary to the operation of carrying out random error correction coding of the transmitted data. Then, the CPU 51 obtains original (not encoded) data. When errors, such as a random error, are detected on the occasion of a decryption, correction is made at this time. The data that the decryption and the correction operations complete is stored to the memory system 4.

Figure 10:
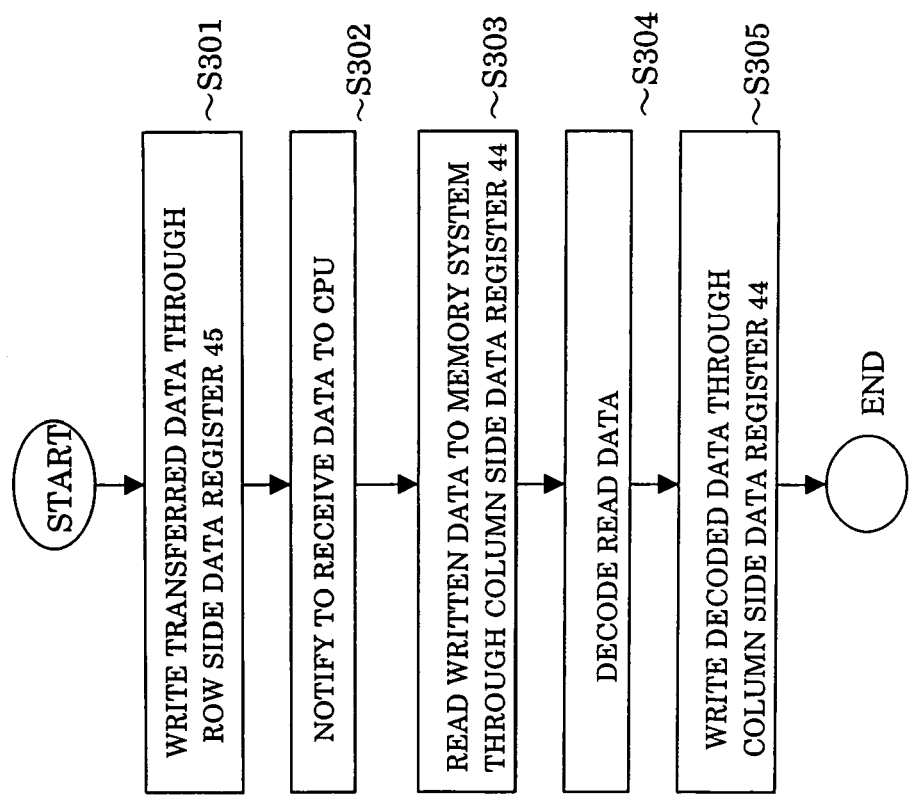
FIG. 10 is a flow chart indicating an operation for transferring data to the memory system according to the invention.

FIG. 10 shows a flow chart describing the steps of the operation explained above. The transceiver circuit 52 writes the data transfer from the external bus 50 in the memory system 4 through the column side data register 45 (S301). In addition, the data are encoded the random error correction and are interleaved. Next, the transceiver circuit 52 notifies CPU 52 that all transferred data from external is written in the memory system 4 (S302). The CPU 51 reads the data written in the memory system 4 through the row side data register 44 (S303). The CPU 51 carries out a decryption operation of the read data (S304). And the CPU 51 writes the decrypted data in the memory system 4 through the column side data register 44 (S305).

Thus, the CPU 51 can begin the decoding of the data by which random error correction was carried out immediately after a data transfer, because it can treat data that is already equivalent to de-interleaved data, only to read data in the memory system 4. If an information processing apparatus uses the memory system 4 including any memory modules 1–3 of the embodiment, it is possible to reduce the operation needed for an interleave and a de-interleave. Devices connected to the external bus 50 also can treat the memory system 4 as a prior memory system.

In addition to the use as storage, the memory modules 1–3 can improve a quality of digital data transfer between electronic devices. Some applications that used the memory modules 1–3 are shown below.

First, memory modules 1–3 may be applied to a communication device like a portable telephone. It is important to guarantee data transferred by a mobile communication device, since a communication state tends to become unstable. Moreover, in order to use the limited electric wave band effectively in the case of the mobile communication device, the mobile communication device needs to fulfill the specification of efficient coding processing. Therefore, after performing, random error correction coding to original data and interleaving the coded data by using the memory modules 1–3, it transmits the interleaved data. On the other hand, a communication device which received the interleaved data is carried out a de-interleave by using the memory modules 1–3, it performs decryption processing, and obtains the original data.

The random error correction code is widely used in the field of more efficient communication data-transfer, since the random error correction code requires the least addition of the redundant bit by coding rather than the burst error correction coding. Even if data causes a burst error at the time of data transfer, the data received as explained above can be guaranteed by using a random error correction coding. However, if an interleave method is performed by CPU, the data transfer between the CPU and a memory system will occur frequently. Moreover, in order to reduce the load of the CPU, some applications have been realized using an exclusive circuit which performs the interleave method. However, the limits of a power supply, size, generation of heat, etc. of a cellular phone are severe.

It becomes possible by using the memory modules 1–3 to suppress the power consumption and generation of heat by the heavy load of the CPU. Moreover, it becomes possible by using the memory modules 1–3 to not need the exclusive circuit for performing the interleave method.

Second, memory modules 1–3 may be applied to a system which needs to perform a high speed data transfer and needs a high data rate guarantee. In this case, memory modules 1–3 can be used for a storage unit of some peripheral devices which transfer data to the CPU. Noise may occur at the time of high-speed data transfer. The data under transfer may change with influences of the noise. Generally, changed data is corrected to original data using parity check. However, the parity check is not strong against a lot of changing. For example, a device called a CPU bridge between the CPU and the storage unit is set, and the memory modules 1–3 are included in an interior of the CPU bridge.

The memory module interior to the CPU bridge can carry out interleave and de-interleave functions, whenever it performs data transfer between the CPU and the memory module. If error correction coding processing is performed by this option, error reconstitution-of-data nature can be raised extensively. Moreover, processing required for the interleave and the de-interleave is not generated. Therefore, it is very effective to use the memory module of the embodiments for the CPU bridge for performing high-speed conversion.

Third, memory modules 1–3 may be applied to an I/O unit of a magnetic disk device. A magnetic disk device has a hazard that it becomes impossible to read data continuously, due to damage on a storage media. However, a magnetic disk device coping with the damage on the storage media can be offered by performing the interleave method and the de-interleave method in the I/O unit using the memory modules 1–3.

The I/O unit carries out random error correction coding of the data written in the magnetic disk device first. Next, the memory module of the I/O section carries out the interleave of the data carried out random error correction coding carried out. And the I/O section writes the data by which the interleave was carried out in a storage media. Thus, about the magnetic disk device which stores the interleaved data, damage occurs in the storage media and it is assumed that a portion of the data cannot be read continuously. Because the stored data is the interleaved data, it can be considered false that it is a random error. Therefore, the I/O section can perform random error correction. As a result, a reliable magnetic disk device can be offered.

Fourth, the memory modules 1–3 may be applied to an I/O unit of the optical disk device. In the case of the optical storage media which can be carried, it is easy to crack the surface of an optical disk. Therefore, a reliable optical disk device can be offered by considering as the same composition as the I/O section of the above-mentioned magnetic disk device.

Next, another application (application 2) using the memory modules 1–3 is explained below.

Figure 11:
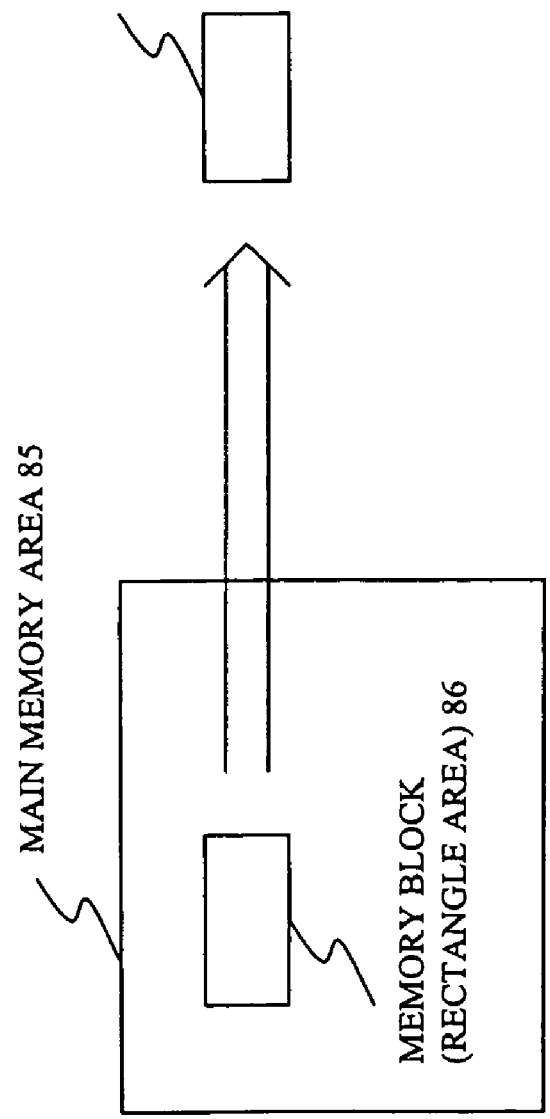
FIG. 11 is a representation of transmitting a rectangular data from a main memory area to a memory storage according to the invention.

An application 2 uses the memory modules 1–3 as picture memory, and transfers data of a rectangular area to another memory. That is, an application 2 is related, when transmitting a rectangular area (memory block) 86 on a main memory area 85 to the memory storage 87 which is built in to a CPU, as shown in FIG. 11.

An information processing system comprises the memory modules 1–3 whose data I/O line width is D bits, and a bus with a data bus width of W (bit) which is the integral multiple of a minimum data-unit width A (bit). Moreover, the integer E with which W<E×A×D is satisfied is defined. A memory system 5 comprises the memory module of the number of the integral multiples of E. Width of memory block 86 is p bytes, and the number of column a rectangular area is q lines.

Figure 12:
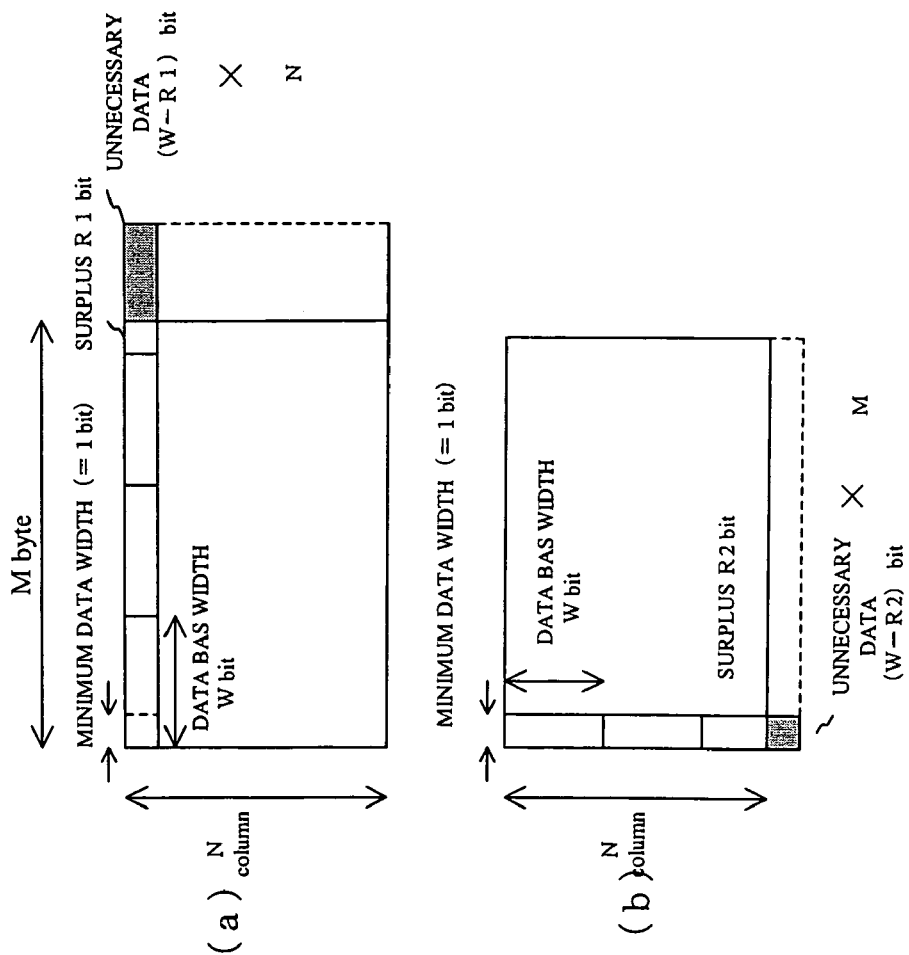
FIG. 12 illustrates data which should be transferred, in the case of transmitting rectangular data according to the invention.

A procedure in the case of transmitting such memory block is explained using FIGS. 12(a) and (b). FIG. 12 shows the case of transferring the memory block which has p bytes of a column direction and q column of a row direction. FIG. 12(a) shows the case of transferring the memory block into column direction continuously, so called a column burst transfer. FIG. 12(b) shows the case of transferring the memory block into row direction continuously, so called a row burst transfer.

As shown in FIG. 12(a) the amount of data transfer for one column may be p×A bits in a transfer of memory block on such address space. And when the p×A bits are transmitted by the data bus of W bit width, only the number of times which broke the p×A bit by W (data bus width) will be transmitted. In the case that the quotient of (p×A/W) is set to K1 and a surplus is set to R1, if R1 is 0, then times of the transfer of one column be K1 times. However, if R1 is not 0, it becomes a transfer of K1+1 time. In this case, transfer data in the frame of K1+1 times has unnecessary data of (W−R1) bits. Since the number of q rows of memory block which should be transmitted, unnecessary data becomes (T1=(W−R1)×q bit) in a transfer of memory block.

As shown in FIG. 12(b), the amount of data transfer for one row may be q×A bits in a transfer of memory block on such address space. And when the q×A bits are transmitted by the data bus of W bit width, only the number of times which broke the q×A bit by W (data bus width) will be transmitted. In the case that the quotient of (q×A/W) is set to K2 and a surplus is set to R2, if R2 is 0, then times of the transfer of one column be K2 times for a transfer of one row. However, if R2 is not 0, it becomes a transfer of K2+1 time. In this case, transfer data in the frame of K1+2 times has unnecessary data of (W−R2) bits. Since the number of p bytes of memory block which should be transmitted, unnecessary data becomes (T1=(W−R2)×p bit) in a transfer of memory block.

Then, T1 is compared with T2. If it is T1>T2 as the comparison result, a row burst transfer is selected. If it is T2>T1 as the comparison result, a column burst transfer is selected. Thereby, the data transfer is more efficient.

Figure 13:
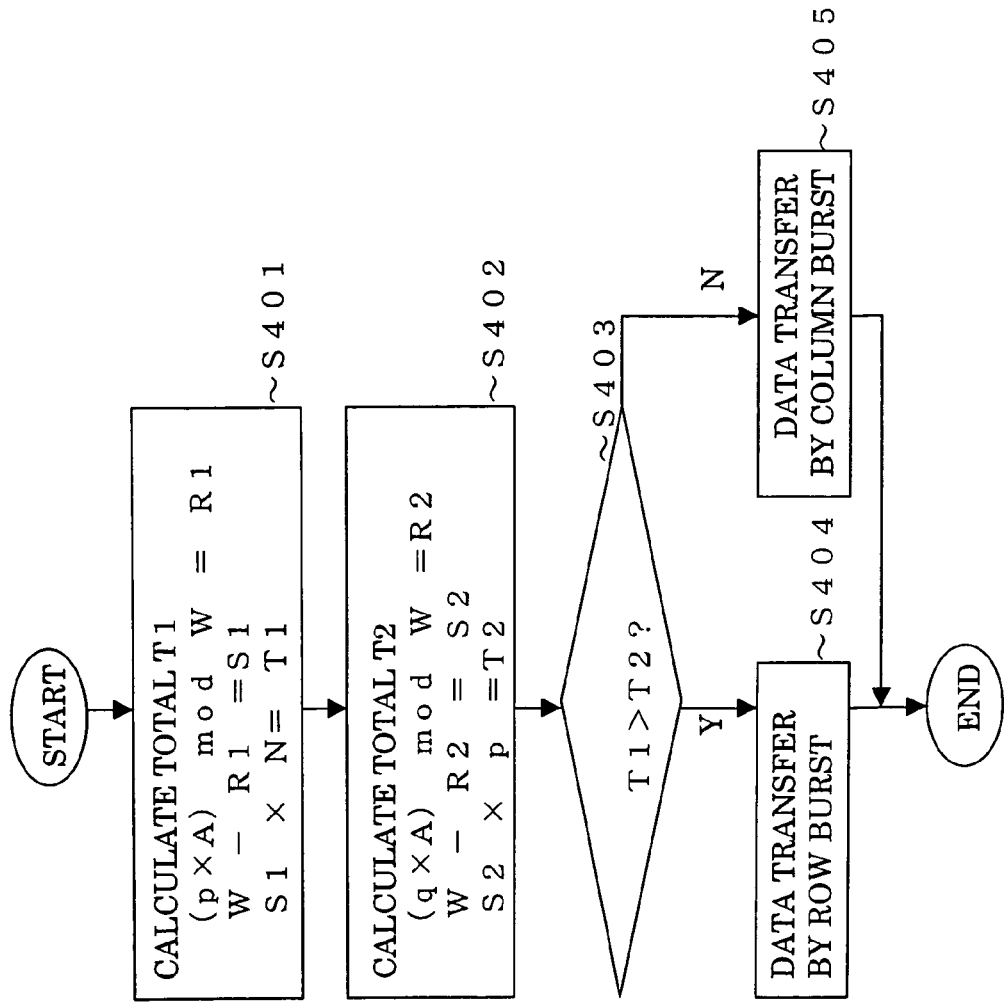
FIG. 13 is a flow chart indicating an operation for selecting access direction in the case of transferring data according to the invention.

FIG. 13 shows a flow chart indicating an operation for selecting access direction in the case of transferring data, tract about explained above.

First, it calculates a quantity of unnecessary data of the column burst transfer. "p×A" is calculated. Here, p is a data width (byte) of the column direction of transferred memory block, and A is the minimum data-unit width (bit). The value as the multiplication result is divided by the data bus width W (bit) to get a surplus R1. "W−R1" is calculated to obtain a calculated value S1 (bit). "S1×N" is calculated to obtain total value T1 (S401).

Next, it calculates a quantity of unnecessary data of the row burst transfer. "q×A" is calculated. Here, q is a data width (byte) of the row direction of transferred memory block, and A is the minimum data-unit width (bit). The value as the multiplication result is divided by the data bus width W (bit) to get a surplus R2. "W−R2" is calculated to obtain a calculated value S2 (bit). "S2×N" is calculated to obtain total value T2 (S402).

T1 and T2 are compared (S403), if it is T1>T2, data transfer is performed the row direction (S404), and if not T1>T2, data transfer is performed the column direction (S405).

A process shown the above flow chart may be performed by a DMA controller. By the process, the DMA controller determines whether to perform a row burst transfer or perform a column burst transfer, and transfers based on a transfer starting address of the data area, a data length, and the determined direction of a burst.

Figure 14:
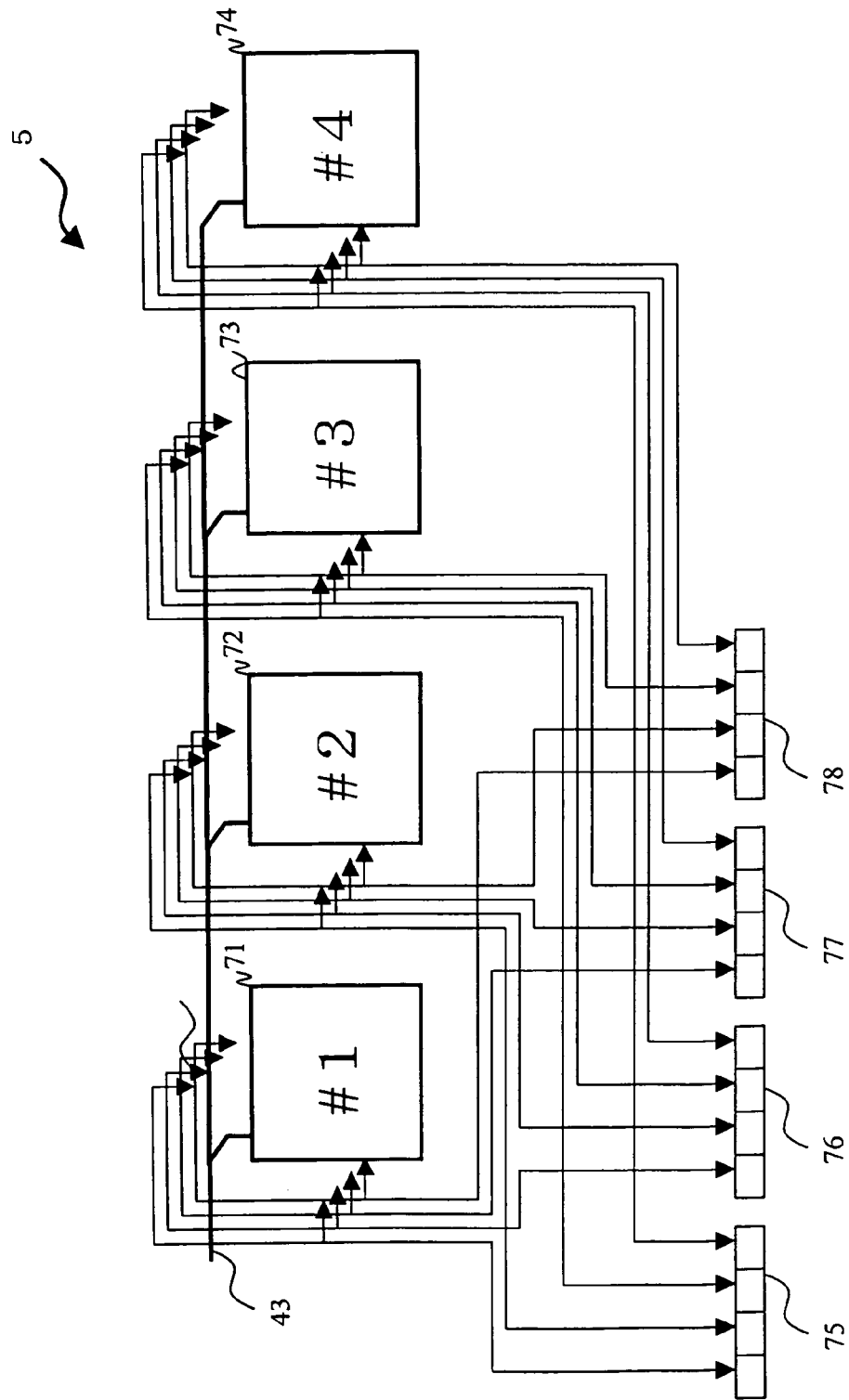
FIG. 14 is a diagram showing a memory system for an application using certain embodiments of memory modules.
Figure 15:
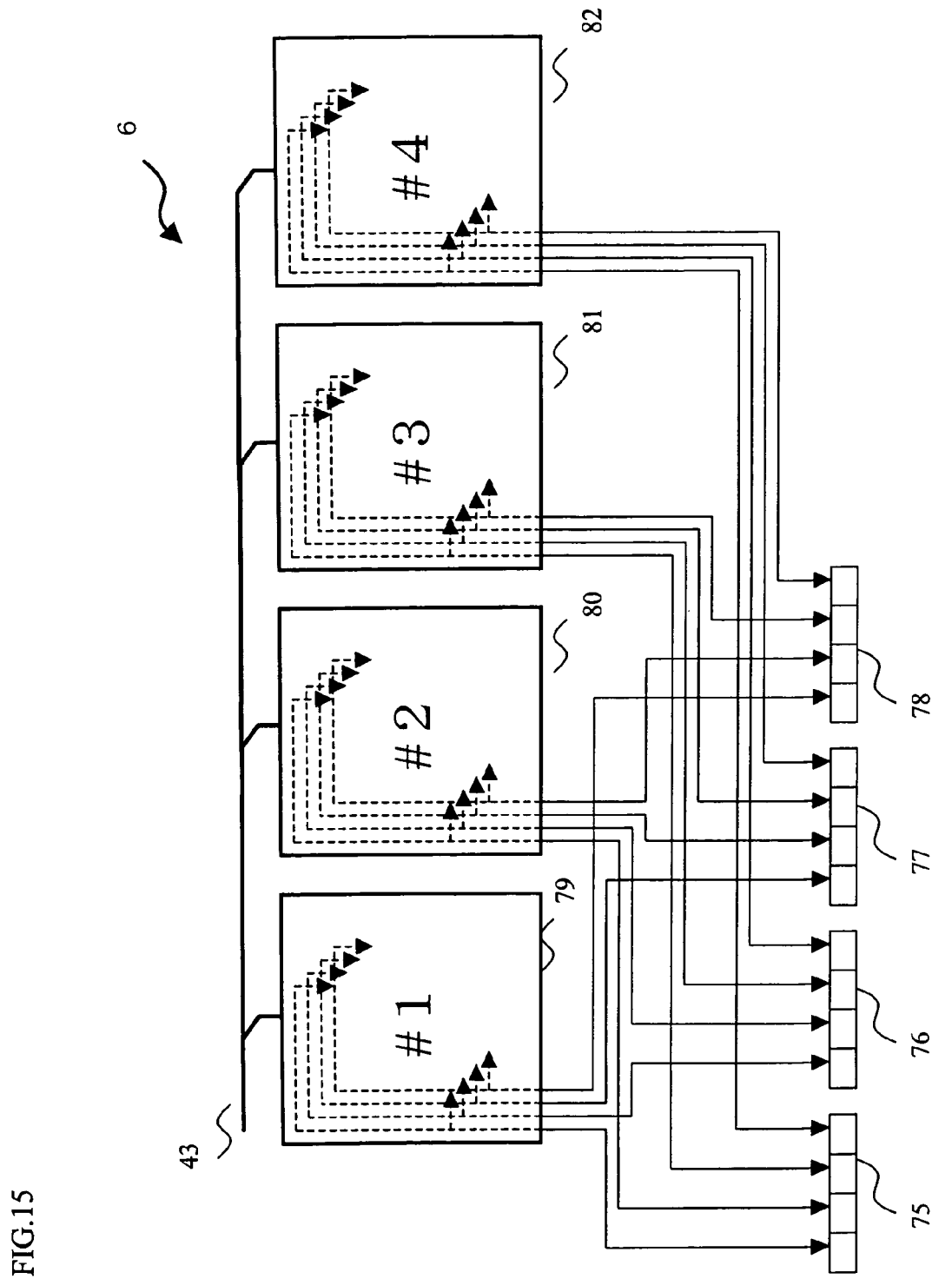
FIG. 15 is a diagram showing a memory system for an application using alternative embodiments of memory modules.

In order to perform the above application 2, when memory modules 1 or 2 are used, it is desirable to consider as a memory system 5 as shown in FIG. 14. When a memory module 3 is used, it is desirable to consider as a memory system 6 as shown in FIG. 15. Both FIG. 14 and FIG. 15 use four parallel memory modules 1–3 whose data I/O width is 4 bits, and show the memory systems 5 and 6 which made data bus width 16 bits. The memory module 71–74 of FIG. 14 is equivalent to memory modules 1 or 2. Moreover, the memory module 79–82 of FIG. 15 is equivalent to a memory module 3. The memory modules are the 4 bits of the minimum access unit width, and comprise four data I/O lines.

Four data I/O lines of each memory module 71–74 of FIG. 14 are utilized by each column side and row side. Each data I/O line is connected with each register 75–78 at a time. On the other hand, the memory module 79–82 of FIG. 15 is an interior of the module, and is utilized by a column side and a row side. Therefore, one data I/O line of a memory module 79–82 is connected with each register 75–78 at a time. Moreover, each register 75–78 is connected with a 16 bits width data bus (not shown) of the external source of the memory system.

Thereby, the memory system 5 and 6 can provide the column burst transfer and the row burst transfer without complicating the read operation by comprising the memory system 5.

Additional advantages and modifications will readily occur to those skilled in the art. Therefore, the invention in its broader aspect is not limited to the specific details and representative embodiments shown and described herein. Accordingly, various modifications may be made without departing from the sprit or scope of the general inventive concept as defined by the appended claims and their equivalents.

The invention claimed is:

1. A memory system comprising:
   a plurality of memory modules, each memory module including,
   a memory array including memory cells comprising M columns×N rows;
   M column lines, each column line being connected with each memory cell configured to each column direction;
   N row lines, each row line being connected with each memory cell configured to each column direction;
   a power source line;
   m column input/output lines to input and output data in a column direction,
   where m is greater than or equal to 1 and less than M;
   n row input/output lines to input and output data in a row direction, where
   n is greater than or equal to 1 and less than N;
   a column address decoder, for receiving a column address and a column access direction signal, the column address decoder being configured to decode the column address and to selectively connect either between a column line specified by the column address and the power source line or between m column lines specified by the column address and m column input/output lines, according to the column access direction signal; and
   a row address decoder, for receiving a row address and a row access direction signal, the row address decoder configured to decode the row address and to selectively connect either between n row lines specified by the row address and n row input/output lines or between a row line specified by the row address and the power source line, according to the row access direction signal;
   a first register, connected to the column input/output lines of each memory module, configured to temporally store data from the column input/output lines of each memory module; and
   a second register, connected to the row input/output lines of each memory module, configured to temporally store every data from the row input/output lines of each memory module.

2. A memory module according to claim 1, wherein the memory array has a first state which is connected between the column line and the power source line by the column address decoder and is connected between the n row lines and the n row input/output lines by the row address decoder, and
   a second state which is connected between the row line and the power source line by the row address decoder and is connected between the m column lines and the m column input/output lines by the column address decoder.

3. A memory module according to claim 1, wherein each memory cell includes a magnetoresistive element or a magnetoresistive element with a semiconductor element.

4. An information processing apparatus comprising:
a memory system, said memory system comprising,
   a plurality of memory modules, each memory module having,
      a memory array including memory cells comprising M columns×N rows, said each memory cell including a magnetoresistive element or a magnetoresistive element with a semiconductor element;
      a first access decoder configured to access the memory array by a column direction; and
      a second access decoder configured to access the memory array by a row direction;
   a first register configured to temporally store data read from each memory module by the first access;
   a second register configured to temporally store data read from each memory module by the second access;
   a processing unit configured to be connected to the second register of said memory system to process data stored in said memory system; and
   a transceiver configured to be connected to the first register of said memory system to perform a data transfer to external sources.

5. A memory module according to claim 4, further including:
   M column lines, each column line being connected to each memory cell configured to each column direction;
   N row lines, each row line connected with each memory cell configured to each column direction;
   a power source line;
   wherein the memory array has a first state which is connected between the column line and the power source line by the first access decoder and is connected between the n row lines and the n row input/output lines by the second access decoder, and
   wherein a second state which is connected between the row line and the power source line by the second access decoder and is connected between the m column lines and the m column input/output lines by the first access decoder.

6. A memory system comprising:
a plurality of memory modules, each memory module including,
   a memory array including memory cells comprising M columns×N rows, said each memory cell including a magnetoresistive element or a magnetoresistive element with a semiconductor element;
   a first access decoder configured to access the memory array by a column direction; and,
   a second access decoder configured to access the memory array by a row direction;
a first register configured to temporally store data read from each memory module by the first access decoder; and
a second register configured to temporally store data read from each memory module by the second access decoder;
M column lines, each column line being connected to each memory cell configured to each column direction;
N row lines, each row line connected with each memory cell configured to each column direction; and
a power source line;
wherein the memory array has a first state which is connected between the column line and the power source line by the first access decoder and is connected between the n row lines and the n row input/output lines by the second access decoder, and
wherein a second state which is connected between the row line and the power source line by the second access decoder and is connected between the m column lines and the m column input/output lines by the first access decoder.

* * * * *